United States Patent
Kim et al.

(10) Patent No.: US 10,461,272 B2
(45) Date of Patent: Oct. 29, 2019

(54) DISPLAY DEVICE AND METHOD FOR MANUFACTURING THE SAME

(71) Applicant: Samsung Display Co., Ltd., Yongin-si (KR)

(72) Inventors: Eunho Kim, Yongin-si (KR); Muhyun Kim, Yongin-si (KR); Suhwan Lee, Yongin-si (KR); Jinwoo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/801,087

(22) Filed: Nov. 1, 2017

(65) Prior Publication Data

US 2018/0083221 A1    Mar. 22, 2018

Related U.S. Application Data

(62) Division of application No. 15/043,020, filed on Feb. 12, 2016, now Pat. No. 9,837,631.

(30) Foreign Application Priority Data

Feb. 16, 2015    (KR) .................. 10-2015-0023198

(51) Int. Cl.
*H01L 51/52* (2006.01)
*H01L 27/32* (2006.01)

(52) U.S. Cl.
CPC ........ *H01L 51/5234* (2013.01); *H01L 27/326* (2013.01); *H01L 27/3246* (2013.01); *H01L 27/322* (2013.01); *H01L 51/5225* (2013.01)

(58) Field of Classification Search
CPC ............... H01L 27/3246; H01L 27/326; H01L 51/5234
See application file for complete search history.

(56) References Cited

U.S. PATENT DOCUMENTS

| 7,488,974 B2 | 2/2009 | Lee et al. |
| 8,227,797 B2 | 7/2012 | Seo |
| 2007/0075627 A1 | 4/2007 | Kimura et al. |

(Continued)

FOREIGN PATENT DOCUMENTS

| KR | 1020070078599 | 8/2007 |
| KR | 1020100001642 | 1/2010 |

(Continued)

OTHER PUBLICATIONS

Non Final Office Action dated Apr. 3, 2017, in U.S. Appl. No. 15/043,020.

(Continued)

*Primary Examiner* — Allan R Wilson
(74) *Attorney, Agent, or Firm* — H.C. Park & Associates, PLC

(57) ABSTRACT

A display device including a first substrate and a pixel defining layer disposed on the first substrate. The pixel defining layer is configured to define an emissive area and a transmissive area. The display device also includes a first electrode disposed in the emissive area, a light emitting layer disposed on the first electrode, and a second electrode disposed in the emissive area and the transmissive area. The second electrode includes an oxide layer in the transmissive area.

5 Claims, 7 Drawing Sheets

(56) References Cited

U.S. PATENT DOCUMENTS

| | | | |
|---|---|---|---|
| 2009/0194780 A1* | 8/2009 | Kwon | H01L 27/3246 257/98 |
| 2011/0148944 A1 | 6/2011 | Kobayashi | |
| 2014/0183472 A1 | 7/2014 | Kim et al. | |
| 2015/0069362 A1 | 3/2015 | Ito | |
| 2015/0200236 A1 | 7/2015 | Kim et al. | |
| 2015/0313014 A1* | 10/2015 | Yamazaki | G02F 1/136286 174/257 |
| 2015/0333110 A1* | 11/2015 | Park | H01L 21/308 257/40 |
| 2016/0093645 A1 | 3/2016 | Lee et al. | |
| 2016/0149156 A1 | 5/2016 | Kim et al. | |
| 2016/0260787 A1 | 9/2016 | Kim | |
| 2017/0148861 A1* | 5/2017 | Kim | H01L 27/3211 |
| 2018/0183016 A1* | 6/2018 | Kuwabara | H01L 27/3246 |
| 2018/0323249 A1* | 11/2018 | Kim | H01L 27/3276 |

FOREIGN PATENT DOCUMENTS

| | | |
|---|---|---|
| KR | 1020140085243 | 7/2014 |
| KR | 1020150084241 | 7/2015 |

OTHER PUBLICATIONS

Notice of Allowance dated Aug. 4. 2017, in U.S. Appl. No. 15/043,020.

* cited by examiner

DISPLAY DEVICE AND METHOD FOR MANUFACTURING THE SAME

CROSS-REFERENCE TO RELATED APPLICATION

This application is a Divisional of U.S. patent application Ser. No. 15/043,020, filed on Feb. 12, 2016, and claims priority from and the benefit of Korean Patent Application No. 10-2015-0023198, filed on Feb. 16, 2015, each of which is hereby incorporated by reference for all purposes as if fully set forth herein.

BACKGROUND

Field

Exemplary embodiments of the present application relate to a display device and a method of manufacturing the display device. In particular, exemplary embodiments relate to a transparent display device and a method of manufacturing a transparent display device.

Discussion of the Background

Display devices are classified into liquid crystal display (LCD) devices, organic light emitting diode (OLED) display devices, plasma display panel (PDP) devices, and electrophoretic display (EPD) devices based on the light emitting scheme of these devices. Examples of a display element that is applicable to these display devices include an OLED, an LCD element, and an EPD element. Among those, the OLED is highly favored as a display element by virtue of its excellent characteristics such as good viewing angle, high contrast, fast response speed, and low power consumption.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a transparent display device and a method of manufacturing a transparent display device.

Exemplary embodiments further provide a display device with improved light transmittance of a transmissive area without increasing the size of the transmissive area.

Exemplary embodiments also provide a transparent display device with improved light transmittance of a transmissive area and a method of manufacturing the transparent display device. More particularly, exemplary embodiments are directed to a transparent OLED display device that may significantly reduce a luminance decrease and to a method of manufacturing the transparent OLED display device.

Additional aspects will be set forth in the detailed description which follows, and, in part, will be apparent from the disclosure, or may be learned by practice of the inventive concept.

An exemplary embodiment discloses a display device that includes a first substrate and a pixel defining layer disposed on the first substrate. The pixel defining layer is configured to define an emissive area and a transmissive area. The display device also includes a first electrode disposed in the emissive area, a light emitting layer disposed on the first electrode, and a second electrode disposed in the emissive area and the transmissive area. The second electrode includes an oxide layer in the transmissive area.

An exemplary embodiment also discloses a display device that includes a first substrate and a pixel defining layer disposed on the first substrate. The pixel defining layer is configured to define an emissive area and a transmissive area. The display device also includes a first electrode disposed in the emissive area, an organic light emitting layer disposed on the first electrode, and a second electrode disposed on the organic light emitting layer.

An exemplary embodiment further discloses a method of manufacturing a display device. The method includes preparing a first substrate and disposing a pixel defining layer on the first substrate. The pixel defining layer is configured to define an emissive area and a transmissive area. The method also includes disposing a first electrode in the emissive area, disposing an organic light emitting layer on the first electrode, disposing a second electrode in the emissive area and the transmissive area, disposing a mask on the second electrode and injecting a modifying agent, and disposing a second substrate facing the first substrate. The mask has a blocking portion corresponding to the emissive area, a transmissive portion corresponding to the transmissive area, and a stopper disposed on a rear surface of the mask at a boundary between the blocking portion and the transmissive portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
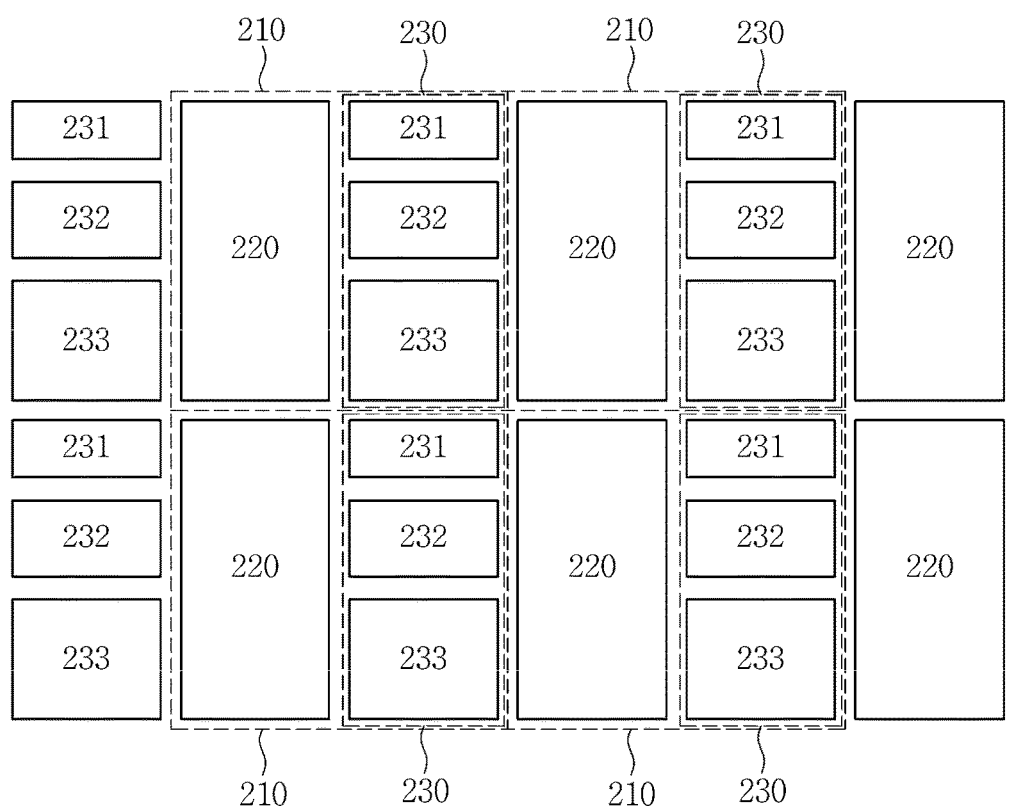
FIG. 1 is a schematic plan view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one member selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The terms "disposed" and "disposing" generally mean "placed on" or "placing on" but also include "formed on" and "forming on." For example, a third layer disposed on a first layer is intended to include the third layer being formed separately and then placed on the first layer as well as the third layer being formed on the first layer. The third layer disposed on the first layer is not limited to being placed directly on or being formed directly on the first layer unless specifically stated. Thus, the third layer disposed on or the third layer being formed on the first layer may have one or more intervening layers between the third layer and the first layer.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In the present application, a "transparent display device" refers to a display device that maintains visual transparency while displaying characters or images. A transparent display device utilizing an OLED is an OLED display device through which an object positioned behind the OLED display device may be observed. The OLED display device may be divided into an emissive area and a transmissive area. A thin film transistor, various signal connecting wirings, an electrode wiring, and an organic light emitting material may be disposed in the emissive area of the transparent OLED display device. A transparent substrate and/or a transparent insulating layer may be disposed in the transmissive area of the transparent OLED display device.

When a transparent display device is in a switched-off state, an object or an image positioned on the opposite side from a user needs to be perceived by the user through the transparent display device. However, even though transmittances of the thin film transistor and the various wirings in the emissive area may not be considerably high, a device that is intended to be "transparent display device" may experience difficulty in achieving an overall high transmittance due to a low transmittance in the emissive area. Although the transmissive area can be increased to compensate for the low transmittance of the emissive area, there is a limit to how much the transmissive area can be increased because the increase in transmissive area means a decrease in emissive area. Thus, a transparent display device with a large transmissive area and correspondingly low emissive area may achieve a more transparent display when the transparent display device is turned off when compared to a similar transparent display device with a smaller transmissive area. However, the transparent display device with a relatively large transmissive area and a relatively small emissive area suffers from having lower luminance when the transparent display device is on.

Hereinafter, a display device 100 according to an exemplary embodiment will be described in detail with reference to FIGS. 1, 2, and 3. It is envisioned that the display device 100 may be an OLED display device or a LCD device or any other suitable material. However, for brevity and convenience of the reader, the display device 100 is described as an OLED display device.

FIG. 1 is a schematic plan view illustrating a display device 100 according to an exemplary embodiment.

FIG. 1 schematically illustrates four pixels 210 disposed adjacent to each other in a 2 by 2 matrix form. Each pixel 210 may include an emissive area 230 and a transmissive area 220. The emissive area 230 may also be referred to as an emissive portion and the transmissive area 220 may also be referred to as a transmissive portion. The emissive area 230 refers to an area on which an image is substantially realized. The transmissive area 220 refers to an area through which external light is transmitted. The emissive area 230 may include a red emissive area 231, a green emissive area 232, and a blue emissive area 233.

In a case where the display device 100 is transparent and is not driven, a user may perceive an object or a background image positioned behind the display device through the transmissive area 220. In addition, when the display device 100 is transparent and is driven, the user may perceive an image of the emissive area 230 and the background through the transmissive area 220 simultaneously. A size ratio between the emissive area 230 and the transmissive area 220 in the pixel 210 may vary based on visibility and transmittance.

A thin film transistor, various signal connecting wirings, an electrode wiring, an organic light emitting material, and the like may be disposed in the emissive area 230. A transparent insulating layer and the like may be disposed in the transmissive area 220. In addition, various signal connecting wirings and the like may be disposed in an area between the transmissive area 220 and the emissive area 230.

As illustrated in FIG. 1, the transmissive area 220 in one pixel 210 may be the same size as the overall emissive area 230. Alternatively, the transmissive area 220 may be the same size the individual red emissive area 231, the individual green emissive area 232, and the individual blue emissive area 233, respectively. Furthermore, the transmissive area 220 may be any size in between the overall emissive area 230 and the size of one of the individual red emissive area 231, green emissive area 232, and blue emissive area 233. For example, the transmissive area may be the same size of the combined red emissive area 231 and green emissive area 232. As another example, the transmissive area 220 may be the same size as the combined green emissive area 231 and the blue emissive area 233. As another example, the transmissive area 220 may be the same size as the combined red emissive area 231 and blue emissive area 233. As a further example, the transmissive area 220 may be larger than the smallest individual red emissive area 231, green emissive area 232, and blue emissive area 233, but not necessarily the same size of any combination of individual emissive areas (e.g., red emissive area 231 and green emissive area 232).

In addition, the respective sizes and disposition order of the red emissive area 231, the green emissive area 232, and the blue emissive area 233 constituting the emissive area 230 are not limited to those illustrated in FIG. 1. Exemplary embodiments include the red emissive area 231, the green emissive area 232, and the blue emissive area 233 having various sizes as well as being or disposed into various forms.

The display device 100 may be applicable to a top-emission type transparent OLED display device. For brevity and convenience of the reader, exemplary embodiments are described below include the display device 100 as a top-emission type transparent OLED display device unless otherwise stated. However, the exemplary embodiments are not limited to a top-emission type transparent OLED device and may include any suitable display device of any suitable emission type.

Figure 2:
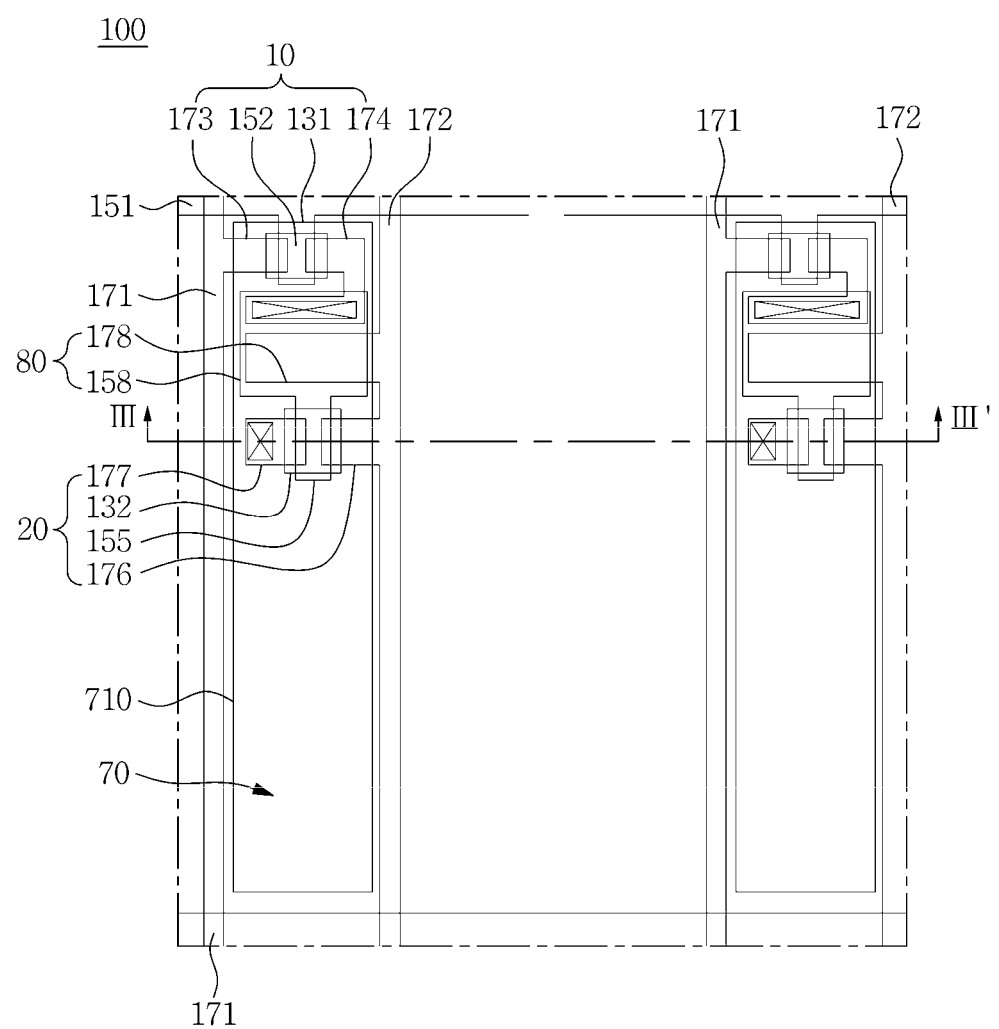
FIG. 2 is an enlarged plan view illustrating an interior configuration of the display device according to an exemplary embodiment.

FIG. 2 is an enlarged plan view illustrating an interior configuration of the display device 100 according to an exemplary embodiment. FIG. 3 is a cross-sectional view taken along sectional line III-III' of FIG. 2. Hereinafter, the emissive area 230 will be described with reference to FIGS. 2 and 3.

Figure 3:
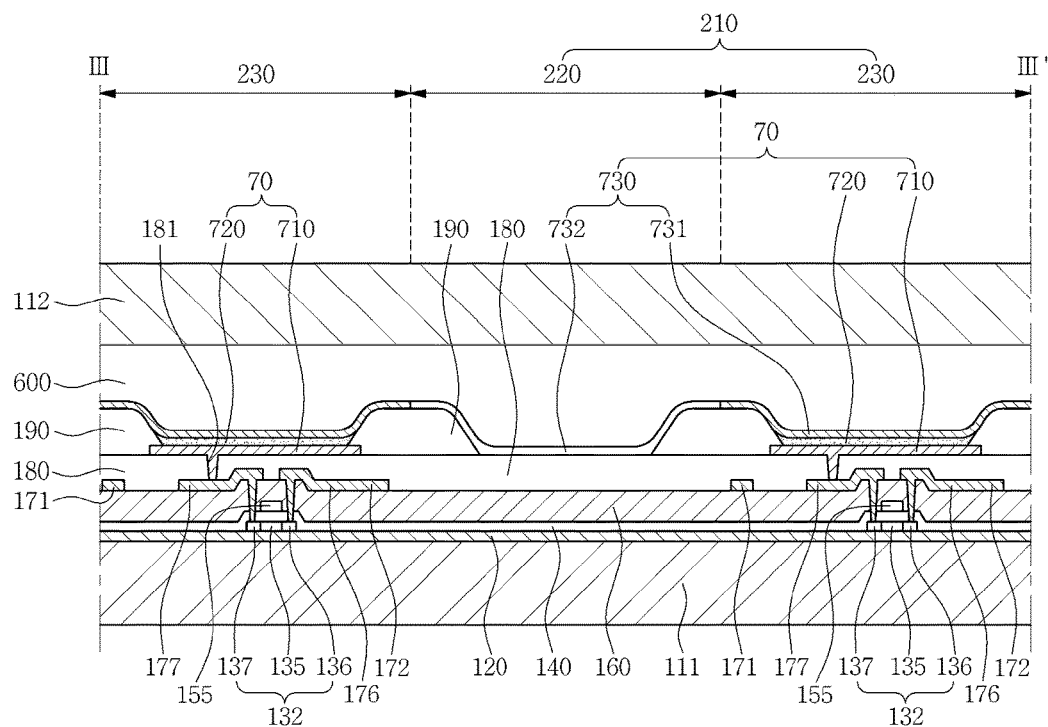
FIG. 3 is a cross-sectional view taken along sectional line III-III' of FIG. 2.

FIGS. 2 and 3 illustrate an active-matrix-type organic light emitting diode ("AMOLED") display device 100 having a 2Tr-1Cap structure according to an exemplary embodiment. The 2Tr-1Cap structure may include two thin-film transistors (TFTs) as well as other components. For example, the 2Tr-1Cap structure may include a switching TFT 10, a driving TFT 20, and a capacitor 80 in each pixel 210 in the emissive area 230 (refer to FIG. 1). However, exemplary embodiments are not limited to this structure or arrangement of components.

For example, the display device 100 (hereinafter, "transparent OLED display device 100") may include three or more TFTs and two or more capacitors in each pixel 210. In addition, the display device 100 may include additional wirings to have various structures. Herein, the term "pixel" refers to the smallest unit for displaying an image, and the transparent OLED display device 100 displays an image using a plurality of pixels 210.

The transparent OLED display device 100 according to an exemplary embodiment includes a first substrate 111, a pixel defining layer 190 disposed on the first substrate 111 that defines the emissive area 230 and the transmissive area 220, a first electrode 710 disposed in the emissive area 230, an organic light emitting layer 720 disposed on the first electrode 710, and a second electrode 730 disposed in the emissive area 230 and in the transmissive area 220. A second substrate 112 may be disposed in the emissive area 230 and the transmissive area 220. In an exemplary embodiment, the second electrode 730 also includes an oxide layer 732 in the transmissive area 220.

In the transparent OLED display device 100, the first electrode 710, the organic light emitting layer 720 disposed on the first electrode 710, and the second electrode 730 disposed on the organic light emitting layer 720 may make or may be an OLED 70. In other words, the OLED 70 may include a first electrode 710, an organic light emitting layer 720 on the first electrode 710, and a second electrode 730 on the organic light emitting layer 720. Herein, at least one first electrode 710 may be disposed on each pixel 210. Thus, the first substrate 111 may include a plurality of first electrodes 710 spaced apart from each other.

The first electrode 710 may be an anode serving as a hole injection electrode and the second electrode 730 may be a cathode serving as an electron injection electrode. However, the exemplary embodiments are not limited to this arrangement. For example, the first electrode 710 may be a cathode electrode and the second electrode 730 may be an anode electrode based on a driving scheme of the transparent OLED display device 100. Further, the first electrode 710 may be a pixel electrode and the second electrode 730 may be a common electrode.

The holes and electrons injected to the organic light emitting layer 720 may combine with each other to form an exciton. When the exciton falls from an excited state to a ground state, light is emitted by the generated energy of the falling exciton.

The capacitor 80 may include a pair of storage electrodes 158 and 178 with an insulating layer 160 interposed between the pair of storage electrodes 158 and 178. The insulating layer 160 may include a dielectric material. Capacitance of the capacitor 80 may be determined by electric charges accumulated in the capacitor 80 and voltage across the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may function as a switching element that selects a pixel 210 to perform light emission. The switching gate electrode 152 may be connected to the gate line 151. The switching source electrode 173 may be connected to the data line 171. The switching drain electrode 174 may be spaced apart from the switching source electrode 173 and may be connected to the first storage electrode 158.

The driving TFT 20 may apply a driving power to the first electrode 710, allowing the organic light emitting layer 720 of the OLED 70 in a selected pixel 210 to emit light. The driving gate electrode 155 may be connected to the first storage electrode 158. The first storage electrode 158 may be connected to the switching drain electrode 174. Thus, the driving gate electrode 155 may be connected to the switching drain electrode 174 through the first storage electrode 158. The driving source electrode 176 and the second storage electrode 178 may be connected to the common power line 172.

The driving drain electrode 177 may be connected to the first electrode 710 of the OLED 70 through a drain contact hole 181.

With the above-described structure, the switching TFT 10 may be operated by a gate voltage applied to the gate line 151 and may transmit a data voltage applied to the data line 171 to the driving TFT 20.

Voltage equivalent to a difference between a common voltage applied from the common power line 172 to the driving TFT 20 and the data voltage transmitted from the switching TFT 10 may be stored in the capacitor 80. Current corresponding to the voltage stored in the capacitor 80 may flow to the OLED 70 through the driving TFT 20 so that the OLED 70 may emit light.

The configuration of the transparent OLED display device 100 according to an exemplary embodiment will be described further with reference to FIG. 3 along with FIG. 2.

In reference to FIG. 3, the transparent OLED display device 100 may include the first substrate 111, the driving TFT 20 (see FIG. 20), the gate insulating layer 140, the insulating layer 160, a passivation layer 180, the OLED 70, and the pixel defining layer 190.

The first substrate 111 may be a substrate for supporting and protecting elements of the transparent OLED display device 100. The first substrate 111 may be a support panel in a lower portion of the transparent OLED display device 100. The first substrate 111 may also be referred to as a lower substrate, a support substrate, a TFT substrate, a lower support member, and the like. The first substrate 111 may include a transparent insulating material. For example, the first substrate 11 may include at least one of glass and plastic. However, an exemplary embodiment is not limited glass or plastic. The first substrate 111 may include any suitable material.

In an exemplary embodiment, the transparent OLED display device 100 is a flexible transparent OLED display device. When the transparent OLED display device 100 is flexible, the first substrate 111 may include or may be formed of a transparent flexible insulating material. For example, the transparent flexible insulating material may include polyimide (PI), polyetherimide (PEI), polyethylene terephthalate (PE), polycarbonate (PC), polymethyl methacrylate (PMMA), polystyrene (PS), a styrene-acrylonitrile (SAN) copolymer, a silicon-acrylic resin, and the like.

In an exemplary embodiment, a buffer layer 120 is disposed on the first substrate 111. The buffer layer 120 may be configured to prevent or efficiently reduce infiltration of undesirable elements as well as planarize the surface of the first substrate 111. The buffer layer 120 may include various materials that may serve the aforementioned functions. For example, the buffer layer 120 may include or may be formed of at least one material selected from the group consisting of: silicon nitride ($SiN_x$), silicon oxide ($SiO_2$), and silicon oxynitride ($SiO_xN_y$). However, the buffer layer 120 may be omitted in consideration of the kinds and process conditions of the first substrate 111.

In an exemplary embodiment, the driving semiconductor layer 132 is disposed on the buffer layer 120. The driving semiconductor layer 132 may include at least one semiconductor material selected from the group consisting of polycrystalline silicon, amorphous silicon, and oxide semiconductors. Further, the driving semiconductor layer 132 may include a channel region 135 that is not doped with impurities and a p-doped source region 136 and a p-doped drain region 137 that are disposed on both sides of the channel region 135. In this case, p-type impurities, such as boron B, may be used as a dopant, and in particular, $B_2H_6$ may be used. Such impurities may vary depending on the kinds of the TFTs.

In an exemplary embodiment, a gate insulating layer 140 including at least one of silicon nitride ($SiN_x$) and silicon oxide ($SiO_2$) is disposed on the driving semiconductor layer 132. The gate insulating layer 140 may include at least one selected from the group consisting of tetra ethyl ortho silicate (TEOS), silicon nitride ($SiN_x$), and silicon oxide ($SiO_2$). In an embodiment, the gate insulating layer 140 has a double-layer structure with an $SiN_x$ layer having a thickness of about 40 nm and a TEOS layer having a thickness of 80 nm. The $SiN_x$ layer and the TEOS layer may be sequentially stacked. However, the gate insulating layer 140 is not limited to the aforementioned configuration.

The driving gate electrode 155, the gate line 151 (refer to FIG. 2), and the first storage electrode 158 (refer to FIG. 2) may be disposed on the gate insulating layer 140. In this case, the driving gate electrode 155 may be disposed to overlap at least a portion of the driving semiconductor layer 132. For example, the driving gate electrode 155 may overlap the channel region 135. The driving gate electrode 155 may serve to prevent the channel region 135 from being doped with impurities when the source and drain regions 136 and 137 of the driving semiconductor layer 132 are doped with the impurities in the forming of or disposing of the driving semiconductor layer 132.

The gate electrode 155 and the first storage electrode 158 may be disposed on the same layer, and may include substantially the same metal material. For example, the metal material may include at least one of molybdenum (Mo), chromium (Cr), and tungsten (W). In an exemplary embodiment, the gate electrode 155 and the first storage electrode 158 may include molybdenum (Mo) or molybdenum alloys.

In an exemplary embodiment, the insulating layer 160, covering the driving gate electrode 155, is disposed on the gate insulating layer 140. The insulating layer 160 may be an insulating interlayer. The insulating layer 160 may include at least one of silicon nitride ($SiN_X$) and silicon oxide ($SiO_X$), which is substantially similar to the gate insulating layer 140. The gate insulating layer 140 and the insulating layer 160 may have a contact hole to expose the source and drain regions 136 and 137 of the driving semiconductor layer 132.

In an exemplary embodiment, the driving source and drain electrodes 176 and 177, the data line 171, the common power line 172, the second storage electrode 178 (refer to FIG. 2) are disposed on the insulating layer 160 of the emissive area 230. The driving source and drain electrodes 176 and 177 are respectively connected to the source and drain regions 136 and 137 of the driving semiconductor layer 132 through the contact hole.

For example, the driving source and drain electrodes 176 and 177, the data line 171, the common power line 172, and the second storage electrode 178 may include or may be formed of a refractory metal including at least one of molybdenum, chromium, tantalum, titanium and alloys thereof. The driving source and drain electrodes 176 and 177, the data line 171, the common power line 172, and the second storage electrode 178 may have a multilayer structure including a refractory metal film and a low-resistance conductive film. The multilayer structure may include a double-layer structure including a chromium or molybdenum (alloy) lower layer and an aluminum (alloy) upper layer or a triple-layer structure including a molybdenum (alloy) lower layer, an aluminum (alloy) middle layer, and a molybdenum (alloy) upper layer.

The driving source and drain electrodes 176 and 177, the data line 171, the common power line 172, and the second storage electrode 178 may include or may be formed of various conductive materials other than the above materials.

Accordingly, the driving TFT 20 may include the driving semiconductor layer 132, the driving gate electrode 155, and the driving source and drain electrodes 176 and 177. However, the configuration of the driving TFT 20 is not limited thereto, and is susceptible to various modifications.

A passivation layer 180 may be disposed on the insulating layer 160 to cover the driving source and drain electrodes 176 and 177, and the like. The passivation layer 180 may include organic materials, such as polyacrylates and polyimides. The passivation layer 180 may be a planarizing layer. The passivation layer 180 may be configured to remove a step difference and planarize a surface below so as to improve light emission efficiency of the OLED 70 to be disposed above.

The passivation layer 180 may include or may be formed of at least one selected from the group consisting of: a polyacrylate resin, an epoxy resin, a phenolic resin, a polyamide resin, a polyimide resin, an unsaturated polyester resin, a poly-phenylenether resin, a poly-phenylenesulfide resin, and benzocyclobutene (BCB).

The passivation layer 180 may have the drain contact hole 181 for exposing the driving drain electrode 177. The first electrode 710 may be disposed on the passivation layer 180 and connected to the driving drain electrode 177 through the drain contact hole 181 of the passivation layer 180.

A pixel defining layer 190 may be disposed on the passivation layer 180 to cover the first electrode 710. The pixel defining layer 190 may be configured to divide adjacent pixels 210 into each other, and may further divides the emissive area 230 and the transmissive area 220 in each pixel 210. Accordingly, the pixel defining layer 190 may be disposed between the adjacent pixels 210 and between the emissive area 230 and the transmissive area 220 in each pixel 210. In addition, the pixel defining layer 190 may include an aperture that exposes a portion of the first electrode 710.

The pixel defining layer 190 may include or may be formed of an organic insulating material, such as polyimide, photo acryl, and benzo cyclo butene (BCB). In addition, the pixel defining layer 190 may include or may be formed of at least one of a photosensitive organic material, and a photosensitive polymer material. For example, the pixel defining layer 190 may include or may be formed of at least one of polyacrylates, polyimides, photo sensitive polyimides (PSPI), photosensitive acryl (PA), and photosensitive novolak resins.

The pixel defining layer 190 may be formed into a taper shape. In a case where the pixel defining layer 190 is formed into a taper shape, the pixel defining layer 190 may be formed using a positive-type photoresist.

The organic light emitting layer 720 may be disposed on the first electrode 710 within the aperture of the pixel defining layer 190, and the second electrode 730 may be disposed on the pixel defining layer 190 and the organic light emitting layer 720.

Accordingly, the OLED 70 may include the first electrode 710, the organic light emitting layer 720, and the second electrode 730. The OLED 70 will be described further below.

A second substrate 112 may be disposed in the emissive area 230 and the transmissive area 220. The second substrate 112 may be disposed above the second electrode 730 while also being spaced apart from the second electrode 730. The second substrate 112 may be sealingly attached to the first substrate 111 having the OLED 70 interposed therebetween. The second substrate 112 may cover the TFTs 10 and 20, the OLED 70, and the like disposed on the first substrate 111 to be sealed and protected from an external environment.

The second substrate 112 may include or may be formed of a transparent insulating material such as glass or transparent plastic. The second substrate 112 may include or may be formed of a material that is substantially the same the first substrate 111. In the case of the top-emission type display device where an image is displayed toward the second substrate 112, the second substrate 112 may include or be formed of a light transmissive material. In addition, the second substrate 112 may have a thin film encapsulation structure with at least one inorganic material and at least one organic layer. The at least one inorganic material and the at least one organic layer may be alternately stacked.

In an exemplary embodiment, a filling member 600 is disposed between the first substrate 111 and the second substrate 112. The filling member 600 may be configured to protect interior elements (e.g., the OLED 70) from impacts that may be externally applied to the transparent OLED display device 100. The filling member 600 may increase device reliability of the transparent OLED display device 100. The filling member 600 may include at least one of an organic sealant and an inorganic sealant. The organic sealant may include at least one of a urethane resin, an epoxy resin, and an acrylic resin. The inorganic sealant may include silicon. A urethane acrylate, for example, may be used as the urethane resin. A butyl acrylate and an ethylhexylacrylate, for example, may be used as the acrylic resin.

In an exemplary embodiment, a color filter may be disposed on the filling member 600 to cover the color of the light emitted from the OLED 70 to a desired color (not shown in FIG. 3). The color filter may be disposed on an area of the filling member 600 corresponding to the emissive area 230 similar to the color filter 500 illustrated in FIG. 7.

In an exemplary embodiment, the display device 100 may not include an opaque metal layer in the transmissive area 220. Thus, the first substrate 111 and the second substrate 112 may exclude an opaque metal layer in the transmissive area 220.

Hereinafter, the OLED 70 according to an exemplary embodiment will be described further with reference to FIGS. 3, 4, and 5.

Figure 4:
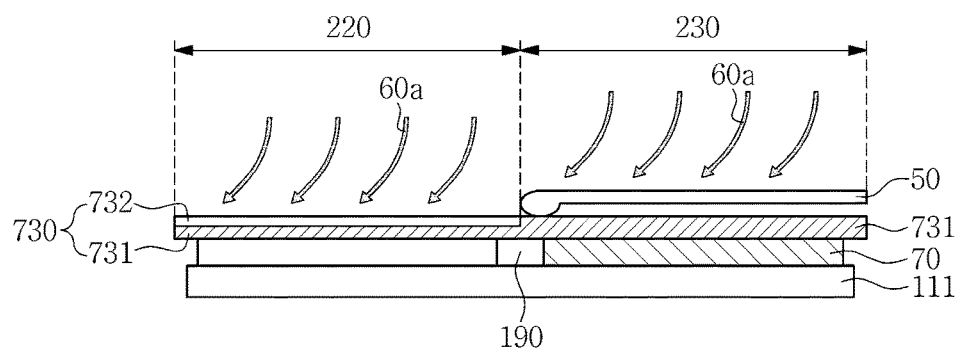
FIG. 4 is a conceptual cross-sectional view illustrating a process of manufacturing a second electrode of the display device according to an exemplary embodiment.

FIG. 4 is a conceptual cross-sectional view illustrating a process of manufacturing the second electrode 730 of the display device according to an exemplary embodiment. FIG. 5 is a schematic cross-sectional view illustrating a process of manufacturing the second electrode 730 of the display device of FIG. 3 using a mask.

The first substrate 111 may include the emissive area 230 and the transmissive area 220. The emissive area 230 may be an area through which light is substantially emitted. The transmissive area 220 may be an area through which light may not be transmitted. The emissive area 230 and the transmissive area 220 may be divided from each other by the pixel defining layer 190.

The OLED 70 may include the first electrode 710, the organic light emitting layer 720, and the second electrode 730.

The organic light emitting layer 720 may be disposed on the first electrode 710 in a pixel area. The second electrode 730 may be disposed on the pixel defining layer 190 and the organic light emitting layer 720.

Examples of methods the transparent OLED display device 100 employs to display an image include: disposing an organic light emitting layer 720 in which respective pixels 210 emit a red color, a green color, and a blue color on their own, and disposing an organic light emitting layer 720 emitting a white color on each pixel 210 along with using a color filter.

In an exemplary embodiment, when the transparent OLED display device 100 includes an OLED display device with respective pixels configured to emit a red color, a green color, and a blue color, the organic light emitting layer 720 configured to emit one of a red color, a green color, and a blue color may be disposed on the first electrode 710 This organic light emitting layer 720 may be exposed through the pixel defining layer 190 in each corresponding red emissive area 230, green emissive area 230, and blue emissive area 230, This organic light emitting layer 720 disposed in each of the red emissive area 230, the green emissive area 230, and the blue emissive area 230 such that the organic light emitting layer 720 in each emissive area 230 is separate from the organic light emitting layer 720 in another emissive area 230. Further, the first electrode 710 may be disposed in the emissive area 230 in each pixel 210 and the organic light emitting layer 720 may be disposed in the emissive area 230.

In an alternate exemplary embodiment, the transparent OLED display device 100 includes the white organic light emitting layer 720 and the color filter. The white organic light emitting layer 720 may be disposed on the first electrode 710 and may be exposed through the pixel defining layer 190, in the red emissive area 230, the green emissive area 230, and a blue emissive area 230. The white organic light emitting layer 720 disposed on each of the red emissive area 230, the green emissive area 230, and the blue emissive area 230 may extend throughout an entire surface of the first substrate 111. Alternatively, the while organic light emitting layer 720 may be separated into portions to be disposed on each of the emissive areas 230 of the pixels 210.

The organic light emitting layer 720 illustrated in FIG. 3 is an organic light emitting layer 720 with respective pixels emit a red color, a green color, and a blue color on their own. The organic light emitting layer 720 may be disposed on the emissive area 230 as illustrated.

The organic light emitting layer 720 may include or be formed of at least one of a low molecular weight organic material and a high molecular weight organic material. At least one of a hole injection layer (HIL) and a hole transporting layer (HTL) may further be disposed between the first electrode 710 and the organic light emitting layer 720. At least one of an electron transporting layer (ETL) and an electron injection layer (EIL) may further be disposed between the organic light emitting layer 720 and the second electrode 730.

As such, the organic light emitting layer 720 may have a multilayer structure including at least one of a main light emitting layer, a hole injection layer (HIL), a hole transporting layer (HTL), an electron transporting layer (ETL), and an electron injection layer (EIL). For example, the hole injection layer (HIL) may be disposed on the first electrode 710, which is a positive end portion, and the hole transporting layer (HTL), main light emitting layer, electron transporting layer (ETL), and electron injection layer (EIL) may be sequentially stacked thereon.

The first electrode 710 and the second electrode 730 may be formed into one of a transmissive electrode, a transflective electrode, and a reflective electrode.

A transparent conductive oxide (TCO) may be used to form the transmissive electrode. The transparent conductive oxide (TCO) may include at least one selected from the group consisting of: indium tin oxide (ITO), indium zinc oxide (IZO), antimony tin oxide (ATO), aluminum zinc oxide (AZO), zinc oxide (ZnO), and alloys thereof.

Metal may be use to form the reflective electrode and the transflective electrode. The metal used to form the reflective electrode and the transflective electrode may include at least one of magnesium (Mg), silver (Ag), gold (Au), calcium (Ca), lithium (Li), chromium (Cr), aluminum (Al), and copper (Cu). The metal may also include a metal alloy of at least one of magnesium (Mg), silver (Ag), gold (Au), calcium (Ca), lithium (Li), chromium (Cr), aluminum (Al), and copper (Cu). In this regard, whether the electrode is a reflective type or a transflective type may be determined based on a thickness of the electrode. In general, the transflective electrode has a thickness of about 200 nm or less, and the reflective electrode has a thickness of about 300 nm or more. As the thickness of the transflective electrode decreases, a level of light transmittance may increase, but resistance may also increase. As the thickness of the transflective electrode increases, the light transmittance may decrease.

In addition, the transflective electrode and the reflective electrode may have a multilayer structure including a metal layer including metal or a metal alloy and a transparent conductive oxide (TCO) layer stacked on the metal layer.

In an exemplary embodiment, the transparent OLED display device 100 is a top-emission type configured to display an image toward the second substrate 112. In this case, the first electrode 710 may include or may be formed of a reflective conductive material. The reflective conductive material may use at least one selected from the group consisting of: lithium (Li), calcium (Ca), lithium fluoride/calcium (LiF/Ca), lithium fluoride/aluminum (LiF/Al), aluminum (Al), silver (Ag), magnesium (Mg), and gold (Au).

For example, the first electrode 710 may include a first sub-electrode (not illustrated) containing a semi-transmissive conductive material having a monolayer structure or a multilayer structure including at least one selected from the group consisting of: lithium (Li), calcium (Ca), lithium fluoride/calcium (LiF/Ca), lithium fluoride/aluminum (LiF/Al), aluminum (Al), silver (Ag), magnesium (Mg), and gold (Au). The first electrode 710 may include a second sub-electrode (not illustrated) disposed on the first sub-electrode and including a conductive material having a high work function, such as indium tin oxide (ITO).

In an exemplary embodiment, the transparent OLED display device 100 is a both-side emission type that is configured to display an image toward both sides of the transparent OLED display device 100 (i.e., towards the first substrate 111 and the second substrate 201). Here, the first electrode 710 may include or may be formed of a transparent conductive oxide (TCO) material that may transmit light. For example, the first electrode 710 may include or may be formed of at least one of indium tin oxide (ITO), indium zinc oxide (IZO), indium tin oxide (ITZO), zinc oxide, and tin oxide.

The first electrode 710 may be disposed in the emissive area 230 in each pixel of the first substrate 111. In the case of including or being formed of the transparent conductive oxide (TCO), the first electrode 710 is transparent, and thus a decrease in transmittance is relatively small even when overlapping the transmissive area 220. However, in a case where the first sub-electrode (not illustrated) overlaps the transmissive area 220, the transmittance may significantly decrease. As described above, the transparent OLED display device 100 may operate in a scheme where holes supplied from the first electrode 710 and electrons supplied from the second electrode 730 are combined to each other in the organic light emitting layer 720 and thereby light is emitted to form an image. In such an embodiment, the first electrode 710 may be disposed in the emissive area 230.

The second electrode 730 may be disposed on the organic light emitting layer 720. The second electrode 730 may be formed of a transflective conductive material in order to form a resonance structure. The second electrode 730 may include a semi-transmissive conductive material having a monolayer structure or a multilayer structure. The second electrode 730 may include at least one selected from the group consisting of: lithium (Li), magnesium (Mg), lithium aluminum (LiAl), aluminum (Al), silver (Ag), calcium (Ca), calcium silver (CaAg), magnesium silver (MgAg), and aluminum silver (AlAg).

The second electrode 730 may have a surface shape, and may be formed over an entire surface of the first substrate 111 as an integrated plate shape. The second electrode 730 may include a non-oxide layer 731 in the emissive area 230 and an oxide layer 732 in the transmissive area 220. Hereinafter, for brevity and for the convenience of the reader, the non-oxide layer 731 and the oxide layer 732 may be referred to as a second electrode 731 of the emissive area 230 and a second electrode 732 of the transmissive area 220, respectively.

The second electrode 732 of the transmissive area 220 is illustrated as only including the oxide layer 732 in FIG. 3 for comparison with respect to the second electrode 731 of the emissive area 230. However, the second electrode 732 may include both the oxide layer 732 and the non-oxide layer 731 in the transmissive area 220 (refer to FIG. 4).

The second electrode 731 of the emissive area 230 and the second electrode 732 of the transmissive area 220 may include or may be formed of the same semi-transmissive conductive material. The second electrode 732 of the transmissive area 220 may include or may be formed of an oxide of the semi-transmissive conductive material. For example, the second electrode 731 of the emissive area 230 may have a multilayer structure including magnesium (Mg) and silver (Ag) and the second electrode 732 of the transmissive area 220 may have a multilayer structure including magnesium oxide and silver oxide.

Figure 5:
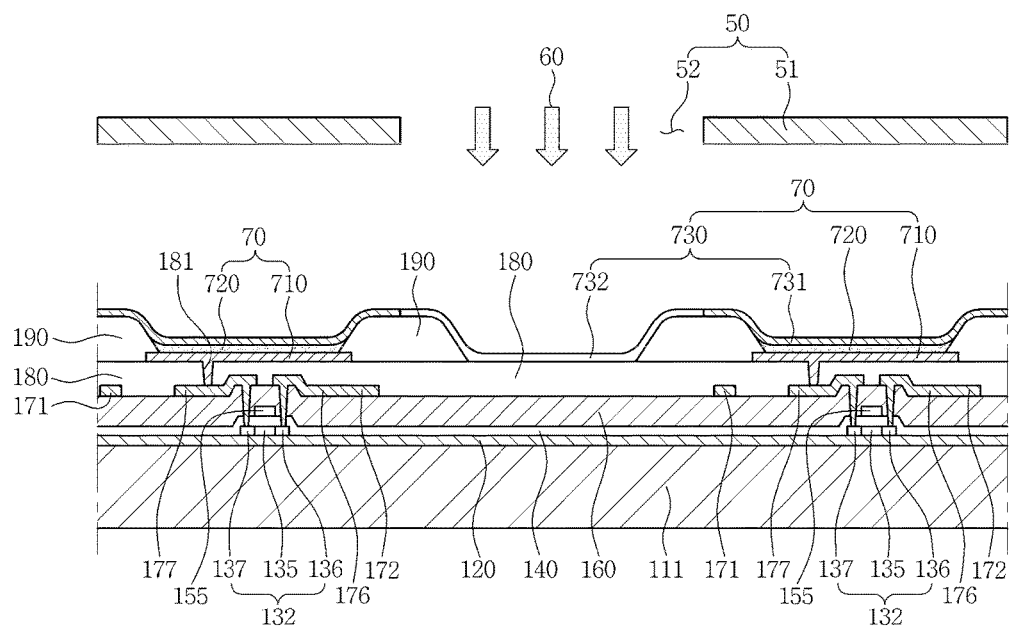
FIG. 5 is a schematic cross-sectional view illustrating a process of manufacturing the second electrode of the display device of FIG. 3 using a mask.

In reference to FIGS. 4 and 5, the second electrode 732 corresponding to the transmissive area 220 may be oxidized using the mask 50. A blocking portion 51 of the mask 50 may be disposed in the emissive area 230, and a transmissive portion 52 of the mask 50 may be disposed in the transmissive area 220. Further, a modifying agent such as an oxidant 60a may be injected to the transmissive portion 52 in a chamber at an oxidizing atmosphere. The second electrode 732 corresponding to the transmissive area 220 may be exposed to the oxidant 60a and may become an oxide of the semi-transmissive conductive material. The oxidant 60a may include oxygen ($O_2$). The mask 50 will be described further below with reference to FIGS. 6A and 6B.

The second electrode 732 of the transmissive area 220 including the oxide of the semi transmissive conductive material may have a light transmittance higher than that of the second electrode 731 of the emissive area 230. For example, the light transmittance of the second electrode 732 of the transmissive area 220 is about 1.1 times to about 2 times the light transmittance of the second electrode 731 of the emissive area 230. Accordingly, in a case where the light transmittance of the second electrode 731 of the emissive area 230 is about 30%, the light transmittance of the second electrode 732 of the transmissive area 220 may be about 50%.

Figure 6A:
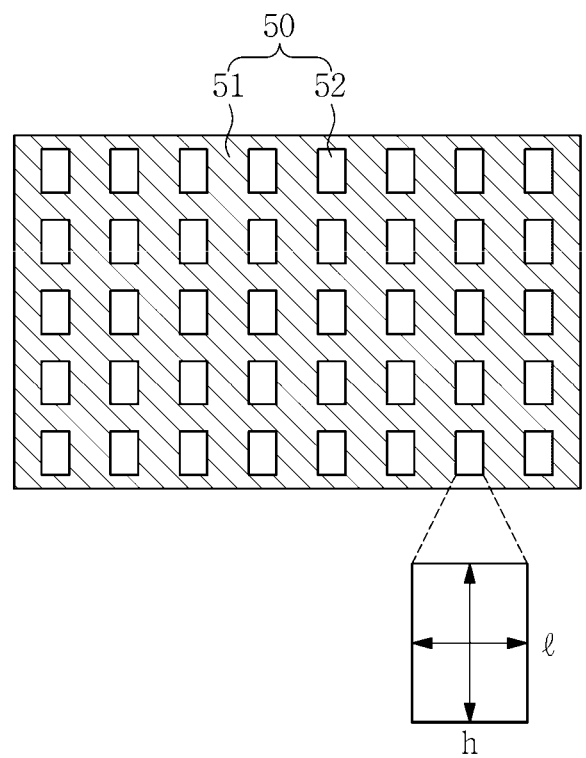
FIG. 6A and FIG. 6B are plan views illustrating the mask used in the process of manufacturing the second electrode of the display device according to an exemplary embodiment.
Figure 6B:
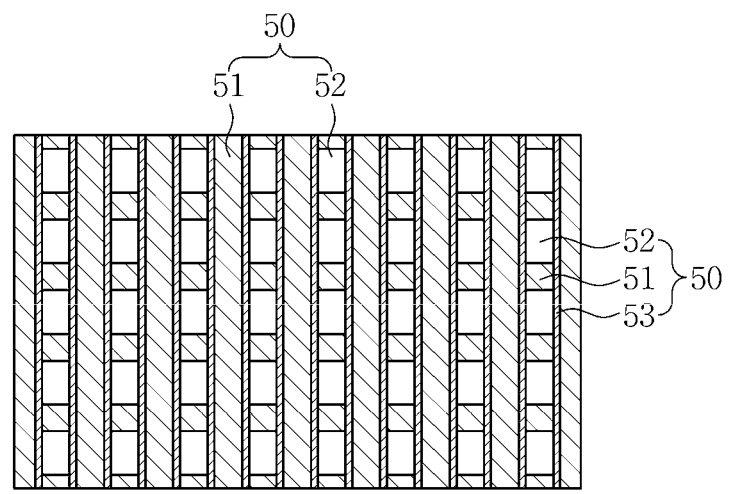

FIG. 6A and FIG. 6B are plan views illustrating the mask 50 used in the process of manufacturing the second electrode 732 of the transparent OLED display device 100 according to an exemplary embodiment.

The mask 50 is a mask used in the oxidation process of the second electrode 732 corresponding to the transmissive area 220. The mask 50 may be a fine metal mask (FMM).

The blocking portion 51 and the transmissive portion 52 may be provided on a front surface of the mask 50 as shown in FIG. 6A. The blocking portion 51, the transmissive portion 52, and a stopper 53 may be provided on a rear surface of the mask 50 as shown in FIG. 6B.

As the transmissive portion 52 of the mask 50 may correspond to the transmissive area 220 of the transparent OLED display device 100, a size (1*h), position. The number of the transmissive portions 52 is substantially the same as those of the transmissive area 220.

In an alternative exemplary embodiment, the transmissive portions 52 are alternately disposed so as to manufacture a mask including half the number of transmissive portions 52 as the number of transmissive areas 220. In such an exemplary embodiment, the second electrode 732 is moved (or the mask 50 is moved) so that the position of the second electrode 732 corresponds to the position of the transmissive portion 52 and the oxidant 60a is injected subsequently so that an oxidation process of a second electrode 732 may be performed. In other words, the oxidation process of the second electrode 732 may include first oxidizing half of the second electrode 732, moving the second electrode 732, some structure including the second electrode 732, or the mask 50, and oxidizing the second half of the second electrode 732.

The blocking portion 51 may correspond to the emissive area 230 of the transparent OLED display device 100 and may serve to block injection of the oxidant 60$a$. The stopper 53 may be disposed at a boundary between the blocking portion 51 and the transmissive portion 52 so as to block leakage of oxidant 60$a$ into the emissive area 230. The stopper 53 may use any material that may serve the blocking function without limitation. As an example, the stopper 53 may use polytetrafluoroethylene (Teflon®).

A process of using the mask 50 to oxidize the second electrode 732 corresponding to the transmissive area 220 in the transparent OLED display device 100 according to an exemplary embodiment is described below with reference to FIGS. 4 and 5. For brevity, descriptions of similar elements described above will not be repeated below. Hereinafter, an OLED display device according to an exemplary embodiment will be described with reference to FIGS. 7 and 8.

Figure 7:
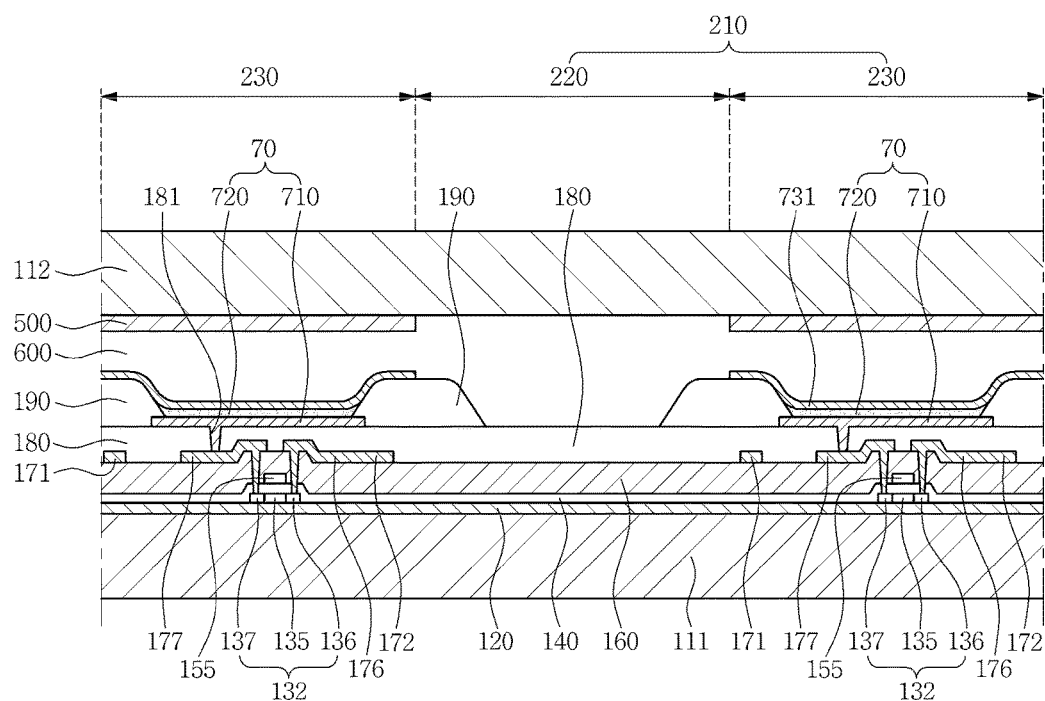
FIG. 7 is a schematic cross-sectional view illustrating a display device according to an exemplary embodiment.
Figure 8:
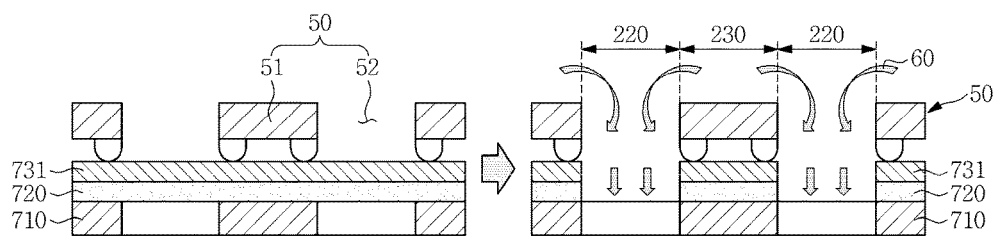
FIG. 8 is a conceptual cross-sectional view illustrating a part of the process of manufacturing the display device of FIG. 7.

FIG. 7 is a schematic cross-sectional view illustrating the transparent OLED display device according to an exemplary embodiment. FIG. 8 is a conceptual cross-sectional view illustrating a part of the process of manufacturing the transparent OLED display device of FIG. 7.

The transparent OLED display device of FIG. 7 is similar to the transparent OLED display device FIG. 3, except that unlike the transparent OLED display device of FIG. 3 the transparent OLED display device of FIG. 7 does not include a second electrode 730 with an oxide layer 732 disposed in the transmissive area 220. In other words, the second electrode 730 of FIG. 7 is only the non-oxide layer 731 disposed in the emissive area 230. In addition, the transparent display device of FIG. 7 illustrates a color filter 500 disposed in the emissive area 230.

In reference to FIGS. 3 and 7, the second electrode 731 may be disposed on each pixel of the first substrate 111 in the emissive area 230. As described above, the emissive area 230 refers to an area on which an image is substantially realized and the transmissive area 220 refers to an area through which external light is transmitted, and thus the second electrode 731 may only be disposed in the emissive area 230.

An OLED 70 may not be disposed on a passivation layer 180 in the transmissive area 220 of the first substrate 111 as shown in FIG. 7. Instead, the passivation layer 180, the insulating layer 160, gate insulating layer 140, and the buffer layer 120 may be disposed in the transmissive area 220 of the first substrate 111 without disposing the OLED 70 in the transmissive area 220. Although not shown in FIG. 7, the passivation layer 180 may directly contact the first substrate 111 in the transmissive area 220 and the refractive indices of the first substrate 111 and the passivation layer 180 may be substantially the same as each other. Accordingly, the distortion phenomenon such as the total reflection of light may be significantly reduced at an interface between the first substrate 111 and the passivation layer 180, and thereby transmittances of the transmissive area 220 and the overall transparent OLED display device 100 may be enhanced.

In an exemplary embodiment, a material for forming the organic light emitting layer 720 and a material for forming the second electrode 731 may be deposited in the transmissive area 220, even after the process is completed. The material for forming the organic light emitting layer 720 and the material for forming the second electrode 731 deposited in the transmissive area 220 may be removed from the transmissive area 220. When the material for forming the organic light emitting layer 720 and the material for forming the second electrode 731 deposited in the transmissive area 220 are removed from the transmissive area 220, a transmission coefficient may increase to thereby increase the transmittance of the overall transparent OLED display device 100.

In reference to FIG. 8, the material for forming the organic light emitting layer 720 and the material for forming the second electrode 731 deposited in the transmissive area 220 may be removed in addition to removal of the material for forming the organic light emitting layer 720 in an exterior portion (not illustrated). The mask 50, as illustrated above with reference to FIGS. 6A and 6B, may be used in at least one of an oxidation process, a plasma etching process, and a laser etching process.

The mask 50 may be equipped prior to removing the material for forming the organic light emitting layer 720 and the material for forming the second electrode 731 deposited in the exterior portion (not illustrated) and the transmissive area 220. An etchant 60$b$ may use at least one of nitrogen trifluoride ($NF_3$) and carbon tetrafluoride (CF4). For example, the etchant 60$b$ may be a gas that is blown into the transmissive portion 52 of the mask 50 through a nozzle (not illustrated). The etchant 60$b$ injected into the transmissive portion 52 of the mask 50 may sequentially etch the material for forming the second electrode 731 and the material for forming the organic light emitting layer 720 to thereby remove the entirety of the materials above the transmissive area 220. In addition, the stopper 53 (shown in FIG. 6B) may prevent the emissive area 230 from being damaged by the etchant 60$b$.

Through the above removing process, the material for forming the second electrode 731 and the material for forming the organic light emitting layer 720 deposited in the transmissive area 220 are removed. Thus, the light transmittance of the transparent OLED display device 100 may be enhanced.

Referring to FIG. 7, a color filter 500 may be disposed on the second substrate 112. The color filter 500 may be disposed in each pixel on the second substrate 112. For example, a red color filter 500 may be disposed in a red emissive area 230. As another example, a green color filter 500 may be disposed in a green emissive area 230. As a further example, a blue color filter 500 may be disposed in a blue emissive area 230.

The organic light emitting layer 720 may be a white organic light emitting layer 720. The white light emitted by the organic light emitting layer 720 may be transmitted through the color filter 500. For example, the white light emitted by the organic light emitting layer 720 may be transmitted through the red color filter 500, green color filter 500, and blue color filter 500 to be converted into a red light, a green light, and a blue light, respectively. As illustrated in FIG. 7, the color filter 500 may be disposed above the organic light emitting layer 720 when the transparent OLED display device is a top-emission type OLED display device.

The color filter 500 may be disposed in an area corresponding to the emissive area 230 on the second substrate 112. As illustrated in FIG. 7, the light emitted from the organic light emitting layer 720 may be transmitted through the color filter 500 to be converted into a predetermined color when the transparent OLED display device 100 is a top-emission type. However, the transmissive area 220 is not an area which emits a predetermined color. Instead, the transmissive area 220 is an area where external light of the transparent OLED display device 100 is transmitted. If the color filter 500 is disposed in the transmissive area 220, a color shift may occur in the color of the external light into a color which the color filter 500 represents. Thus, the color filter 500 may only be disposed in the emissive area 230 and may be absent from the transmissive area 220.

A black matrix (not illustrated) may be disposed on the second substrate 112. The black matrix may be disposed on each pixel 210 boundary. The black matrix may include or may be formed of at least one of chromium (Cr), an opaque metal layer, and a resin. The black matrix may separate pixels and the color filters 500 disposed on the respective pixels 210 from one another. However, in an exemplary embodiment, the display device 100 may not include a black matrix or an opaque metal layer in the transmissive area 220. Thus, the first substrate 111 and the second substrate 112 may exclude a black matrix or an opaque metal layer in the transmissive area 220.

A filling member 600 may be disposed between the first substrate 111 and the second substrate 112. The filling member 600 may protect internal elements of the transparent OLED display device 100, such as a TFT and the OLED 70, from external moisture, air, impact, and the like. The filling member 600 may also be referred to as an encapsulation portion, an encapsulation member, a sealing layer, or a sealing member.

The filling member 600 may be disposed between the first substrate 111 and the second substrate 112. In particular, the filling member 600 may be disposed on the OLED 70, the passivation layer 180, and the pixel defining layer 190. The filling member 600 may be disposed between the OLED 70, the passivation layer 180, and the pixel defining layer 190 on one side and the color filter 500 and the second substrate 112 on the other side. Thus, the filling member 600 may directly contact the passivation layer 180 disposed above the first substrate 111 and the second substrate 112 in an area corresponding to the transmissive area 220 of the first substrate 111. The filling member 600 may use a face seal.

A refractive index of the filling member 600 may be substantially the same as a refractive index of the passivation layer 180. The refractive indices of the first substrate 111, the passivation layer 180, the filling member 600, and the second substrate 112 may be substantially the same as one another in an area corresponding to the transmissive area 220 of the first substrate 111. A material for forming the filling member 600 so as to match the refractive indices may include glycerol, 1,2-propanediol, glycerin, trimethylolpropane, triethanolamin, ethylene glycol, 1,3-propanediol, 1,4-butanediol, 1,8-octane diol, 1,2-butanediol, 2,3-butanediol, 1,2-pentanediol, etohexadiol, p-methane-3,8-diol, and 2-methyl-2,4-pentanediol. However, the material for forming the filling member 600 is not limited to these materials and may use any adhesive material having a refractive index substantially the same as that of the first substrate 111.

In the transparent OLED display device 100 according to an exemplary embodiment, refractive indices of insulating materials constituting the passivation layer 180 and the filling member 600 between the first substrate 111 and the second substrate 112 in the transmissive area 220 are substantially the same as those of the first substrate 111 and the second substrate 112. Accordingly, in an area corresponding to the transmissive area 220 of the transparent OLED display device 100, a distortion phenomenon such as total reflection of light may be significantly reduced.

A method of manufacturing the transparent OLED display device 100 according to an exemplary embodiment includes: preparing the first substrate 111; disposing the pixel defining layer 190 configured to define the emissive area 230 and the transmissive area 220 on the first substrate 111; disposing the first electrode 710 in the emissive area 230; disposing the organic light emitting layer 720 on the first electrode 710; disposing the second electrode 730 in the emissive area 230 and the transmissive area 220; disposing the mask 50 on the second electrode 730 and injecting a modifying agent; and disposing the second substrate 112 facing the first substrate 111. The modifying agent may be an oxidant 60a (e.g., oxygen ($O_2$)) and/or an etchant 60b (e.g., nitrogen trifluoride ($NF_3$) and/or carbon tetrafluoride (CF4)).

A method of manufacturing the transparent OLED display device 100 according to an exemplary embodiment also includes: preparing the first substrate 111; disposing the pixel defining layer 190 configured to define the emissive area 230 and the transmissive area 220 on the first substrate 111; disposing the first electrode 710 in the emissive area 230; disposing the organic light emitting layer 720 on the first electrode 710; and disposing the second electrode 730 in the emissive area 230. Thus, according to an exemplary embodiment, the second electrode 730 may not be disposed in the transmissive area 220.

In an exemplary embodiment, the mask 50 has a blocking portion 51 corresponding to the emissive area 230 and a transmissive portion 52 corresponding to the transmissive area 220. The mask 50 may also include a stopper 53 that is provided on a rear surface of the mask 50 at a boundary between the blocking portion 51 and the transmissive portion 52.

As set forth above, according to exemplary embodiments, the display device 100 may be enhanced in terms of light transmittance of the transmissive area 220 and the overall display device 100. Also, according to exemplary embodiments, a decrease in luminance of the display device may be significantly mitigated. Further, according to exemplary embodiments, a method of manufacturing the transparent display device may be provided that manufactures a transparent display device that is enhanced in terms of light transmittance and improved in terms of a luminance (i.e., a reduction in the decrease of luminance typically associated with manufacturing a transparent display device).

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A method of manufacturing a display device, the method comprising:
preparing a first substrate;
disposing a pixel defining layer on the first substrate, the pixel defining layer configured to define an emissive area and a transmissive area;
disposing a first electrode in the emissive area;
disposing an organic light emitting layer on the first electrode;
disposing a second electrode in the emissive area and the transmissive area;
disposing a mask on the second electrode and injecting a modifying agent; and
disposing a second substrate facing the first substrate, wherein the mask has a blocking portion corresponding to the emissive area, a transmissive portion corresponding to the transmissive area, and a stopper disposed on a rear surface of the mask at a boundary between the blocking portion and the transmissive portion.

2. The method of claim 1, wherein the modifying agent comprises an etchant.

3. The method of claim 2, wherein the etchant is configured to sequentially etch the second electrode and the organic light emitting layer in the transmissive area.

4. The method of claim 2, wherein the etchant comprises at least one of nitrogen trifluoride ($NF_3$) and carbon tetrafluoride ($CF_4$).

5. The method of claim 2, wherein the stopper is configured to prevent the second electrode and the organic light emitting layer in the emissive area from being damaged by the etchant.

\* \* \* \* \*